United States Patent
Yamada et al.

[19]

[11] Patent Number: 6,103,400

[45] Date of Patent: Aug. 15, 2000

[54] ELECTRODE FOR DIELECTRIC-THIN FILM DEVICE, AND ULTRASONIC WAVE OSCILLATOR USING THE ELECTRODE

[75] Inventors: Akira Yamada; Takehiko Sato; Chisako Maeda; Toshio Umemura; Fusaoki Uchikawa, all of Tokyo, Japan

[73] Assignee: Mitsubishi Denki Kabushiki Kaisha, Tokyo, Japan

[21] Appl. No.: 09/081,274

[22] Filed: May 20, 1998

[30] Foreign Application Priority Data

Jan. 16, 1998 [JP] Japan .................................. 10-007034

[51] Int. Cl.$^7$ ................................ H01B 1/02; H03B 5/32
[52] U.S. Cl. .......................... 428/627; 428/457; 428/469; 428/472; 428/697; 428/698; 428/699; 428/701; 428/702
[58] Field of Search .................................... 428/472, 469, 428/457, 698, 697, 695, 701, 702, 627

[56] References Cited

U.S. PATENT DOCUMENTS 4,907,040  3/1990  Kobayashi et al. ........................ 357/4

5,409,762  4/1995  Ozaki et al. ............................ 428/472

FOREIGN PATENT DOCUMENTS 63-302538  12/1988  Japan .
6350143  12/1994  Japan .

OTHER PUBLICATIONS

Ye et al., "Experimental Studies On Primary And Secondary Pyro–electric Effects In Pb $(Zr_xTi_{1-x})$ $O_3$, $PbTiO_3$, And ZnO Thin Films", Journal of Applied Physics, vol. 70, No. 10, Nov. 1991, pp. 5538–5543.

*Primary Examiner*—Archene Turner
*Attorney, Agent, or Firm*—Leydig, Voit & Mayer

[57] ABSTRACT

An electrode for a dielectric thin film device includes an adhesive layer adhering to a substrate, a diffusion suppressing layer containing compounds of metal elements constituting the adhesive layer or the substrate, and a main conduction layer. The crystallinity is enhanced by preventing diffusion of unnecessary elements into the dielectric thin film.

5 Claims, 3 Drawing Sheets

ELECTRODE FOR DIELECTRIC-THIN FILM DEVICE, AND ULTRASONIC WAVE OSCILLATOR USING THE ELECTRODE

BACKGROUND OF THE INVENTION

1. Field of the Invention

The present invention relates to an electrode for a dielectric thin film device which has a superior crystalline characteristic, a method of manufacturing device, and an ultrasonic wave oscillator using it. More particularly, the present invention relates to an electrode for a dielectric thin film device which comprises a diffusion preventing layer suppressing diffusion of unnecessary elements into an uppermost surface layer of a underlying electrode, which causes deterioration of the dielectric thin film characteristics, a method of manufacturing device, and an ultrasonic wave oscillator using the electrode.

2. Description of the Prior Art

Dielectric substances mean materials having a variety of characteristics such as paraelectric, ferroelectric, pyroelectric, and piezoelectric properties. The devices to which these dielectric thin films are applied are being employed in extensive fields. Many of the devices in which a dielectric thin film is used require at least the dielectric thin film and an electrode for driving the film. Formation of the dielectric thin film is performed by a variety of thin film forming methods such as a sputtering or a chemical vapor deposition (CVD). In such methods, except when only a few materials such as zinc oxide or aluminum nitride are used, the formation is often carried out at a high temperature in a range of 400° C. to 700° C.

This kind of tendency is found more frequently when a complicated chemical compound such as double oxide is made into a thin film rather than when a simple chemical compound is made into the one. The tendency is also found frequently when trying to manufacture a material of a high quality. When the driving electrode is formed after the formation of the dielectric thin film, the material is determined mainly by electrical characteristics required, and no other major restriction is needed.

However, when, in view of the device configuration, the driving electrode can not help being formed before a process in which the dielectric thin film is formed, many problems occurs. The most difficult problem is as follows: At the time of the dielectric thin film formation, in some cases, the electrode may suffer from a thermal deterioration such as the oxidation in the environment, and the electrode may react with the dielectric thin film, thus causing a deterioration of the characteristics in the two. In order to avoid such phenomena, a noble metal such as platinum is so often employed generally as a material for the electrode.

Also, only the platinum does not necessarily brings about an enough adhesive property for a ground on which the electrode is formed, for example, a silicon oxide film, and thus there exists a possibility that defects such as the peeling take place. Accordingly, in most cases, a substance such as metal titanium or metal chromium is formed between platinum and a substance such as silicon dioxide as an adhesive layer.

Chian-ping Ye et al. showed, in "Experimental studies on primary and secondary pyroelectric effects in Pb (ZrxTi (1-x)) O3, PbTiO3, and ZnO thin films" described in J. Appl. Phys. 1991, No. 70, p. 5538, a high sensitive pyroelectric sensor having a cavity of lifting structure to which applied is the dielectric substance (pyroelectric substance) in the title using microetching technology. Employed as an electrode in the pyroelectric sensor is an electrode configured by platinum and titanium.

Moreover, disclosed in JP-A No. Hei 6-350154 is a piezoelectric device of floating structure, which is formed by forming on a substrate an insulating film, a lower side thin film electrode, a piezoelectric film, and an upper side thin film electrode, and by then eliminating a substrate on the rear side of the substrate and a substrate under a portion which is to become a resonator. Employed in the device, too, is an electrode configured by platinum Pt and titanium Ti.

As described above, in many cases, the electrodes, which are constituted by a combination of a noble metal represented by platinum and a metal of a superior adhesive property represented by titanium, are easy to be applied to a variety type of dielectric thin films and thus are so widely used.

SUMMARY OF THE INVENTION

Since the conventional electrodes for dielectric thin film device are configured above, many of the dielectric thin films exhibit a good crystalline property and dielectric characteristics on a pure platinum electrode. However, in the case of a configuration in which substances such as titanium or chromium are employed as an adhesive layer, the substances are apt to diffuse into a platinum layer or apt to be oxidized at the time of the dielectric thin film forming or a process of making the dielectric thin films into completed devices. As a result, in most cases, the diffusion phenomenon gives rise to a creation of different phases into the platinum layer or a decrease in a crystalline property of the platinum. This results in the following problems: Characteristics of the dielectric thin films are deteriorated, and an electrical conductivity of the electrodes themselves tends to be decreased.

This kind of phenomenon is not limited to platinum. Although a specific electrode exists for which the dielectric thin films are able to exhibit the best characteristic thereof, only the specific electrode is not enough to show an adhesive property and a process-resistant property for the substrate. Accordingly, even in the case of using the specific electrode, this kind of phenomenon can not be avoided when a different material must be formed between the substrate and the electrode. Here, when a conduction layer (for example, Pt) over the adhesive layer is thick enough to be able to neglect a diffusion from the adhesive layer, or the adhesive layer is thin enough, the above-mentioned problems are not likely to emerge. However, in the case of adopting this kind of configuration, there may emerge a danger of disappearance of the adhesive layer or an adhesive effect due to a diffusion of the adhesive layer itself.

Also, in the case of a device in which the piezoelectric property of a dielectric substance is used, if the piezoelectric thin film is thin enough, weight of the electrodes added to the piezoelectric thin film suppresses the oscillation thereof, thus directly resulting in a decrease in the piezoelectric characteristics. This requires that a thickness of an electrode film should be thin (light) enough.

Moreover, in the case of a pyroelectric type infrared rays sensor in which the pyroelectric property of a dielectric substance is used, incident infrared rays are detected as an increase in temperature in the detection unit, that is, as a heat. This requires that a heat capacity in the detection unit should be as small as possible, and in this case, too, components such as an electrode are required to be thin. Consequently, it is important to find how this phenomenon can be suppressed so as to embody a dielectric thin film of an excellent crystalline property and a device to which this dielectric thin film is applied.

The present invention has been made in order to solve the above-mentioned problems, and the object thereof is to obtain an electrode for dielectric thin film device which comprises a diffusion preventing layer capable of suppressing a diffusion of unnecessary elements into an uppermost surface layer of a underlying electrode, which causes a deterioration of the dielectric thin film characteristics, and a method of manufacturing thereof.

Furthermore, another object of the present invention is to obtain an ultrasonic wave oscillator using the above-mentioned electrode.

In order to attain the above-mentioned object, according to one aspect of the present invention, the electrode for dielectric thin film device is configured by a main conduction layer composed of a good conductor and being mainly in charge of an input and an output of an electrical signal in said electrode, an adhesive layer for strengthening an adhesive property between the main conduction layer and the substrate, and a diffusion suppressing layer which intervenes between these two layers so as to suppress a diffusion of elements from the substrate and the adhesive layer into the main conduction layer.

On account of this, even when a high temperature treatment is performed so as to enhance a crystalline property at the time of formation of the main conduction layer, the diffusion suppressing layer is allowed to prevent the diffusion of elements into the main conduction layer, and thus no different phases are created inside. Accordingly, the crystalline property in the main conduction layer becomes superior one, and there occurs no deterioration in the crystalline property of a dielectric thin film to be formed thereon. Consequently, if a completed electrode for dielectric thin film device is applied to the device, there is provided an effect of increasing the device characteristics.

According to one aspect of the present invention, the diffusion suppressing layer is composed of compounds, oxides, or nitrides of a metal element constituting the adhesive layer, and preferably the diffusion suppressing layer contains constituting compositions of the main conduction layer.

On account of this, since the diffusion suppressing layer is configured to contain the compounds of the metal element constituting the adhesive layer, the compounds retained within the adhesive layer are enabled to close a main diffusion path for the metal element, and thereafter there is provided an effect of extremely suppressing the diffusion. Further, since the diffusion suppressing layer is configured to contain the oxides or the nitrides of the metal element constituting the adhesive layer, there is provided the following effects: The oxides are obtained by briefly performing the heating treatment in an oxidizing atmosphere including an oxidizing gas, and the nitrides are obtained by performing the nitriding treatment with an assistance of the plasma in a nitriding gas. Still further, since the diffusion suppressing layer is configured to contain the constituting compositions of the main conduction layer, there is provided an effect of enhancing an adhesive property between the diffusion suppressing layer and the main conduction layer.

It is required that the diffusion suppressing layer, apart from the effect of preventing the diffusion of element, should have an enough adhesive strength towards the main conduction layer and the adhesive layer, and in addition should be stable for many kinds of environments exposed during the process.

The formation of the diffusion suppressing layer makes it possible to prevent the deterioration in the dielectric characteristics without an unnecessary increase in the film thickness. In order to suppress the element diffusion from the adhesive layer as a ground, it is effective to cause compounds of the element, which are expected to diffuse, to be contained in advance within the diffusion suppressing layer.

Formation of the compounds is effectively carried out by performing a treatment of making the diffusing element into the compounds thereof after the diffusion from the ground has been executed to some extent or simultaneously with the diffusion, thereby fixing the element under diffusion as the compounds. This kind of treatment makes it possible to close the main diffusion path for the element and thereafter to extremely suppress the diffusion. Examples of the compounds can first be the oxides, which are available most easily, and then be the nitrides.

At the time of forming the oxides, it is simple and convenient to carry out the heating treatment in the oxidizing atmosphere including the oxidizing gas. An example of an effective type of oxidizing gas may be an oxygen gas, an ozone gas, or a nitrous oxide gas. It is allowable to mix these gases with a gas of low reactivity such as an argon or a nitrogen. In the case of a single gas, the extent of the oxidation thereof can be varied by controlling the pressure, a ratio and a pressure of a mixed gas, and the temperature.

Formation of the nitrides is possible only by performing the nitriding treatment with an assistance of the plasma in the nitriding gas. Included as an example of the nitriding gas is a nitrogen gas or an ammonia gas. It is allowable to mix these gases with an inert gas such as an argon, or further a hydrogen gas. In the case of the formation of the nitrides, as is the case with that of the oxides, it is possible to vary the extent of the nitrides to be formed by controlling the gas ratio, the gas pressure, the temperature, or the plasma output. It is also possible to form the nitrides by implanting ions of nitrogen and causing the reaction thereof.

According to one aspect of the present invention, examples of a material most suitable as the adhesive layer may be titanium, chromium, tantalum, vanadium, niobium, zirconium, and so on. It is effective to contain the oxides or the nitrides of each of the these elements in the diffusion suppressing layer in order to enhance the adhesive property and a junction property between the adhesive layer and the diffusion suppressing layer as well as in order to obtain the diffusion suppressing effect.

According to one aspect of the present invention, there is a provided a portion in which content of the compounds in the diffusion suppressing layer, when expressed using a ratio of metal atoms only, falls in a range from more than 0 atomic % to 75 atomic %. On account of this, there is furnished an effect of ensuring the adhesive property towards the main conduction layer as well as of sufficiently obtaining the element diffusion suppressing effect given by the diffusion suppressing layer.

According to one aspect of the present invention, the adhesive layer is configured by one kind or more of titanium, chromium, tantalum, vanadium, and niobium, and the diffusion suppressing layer contains the oxides of the constituting compositions of the adhesive layer. On account of this, there is furnished an effect of enhancing the adhesive property and the junction property between the adhesive layer and the diffusion suppressing layer as well as of enhancing the diffusion suppressing effect.

According to one aspect of the present invention, the main conduction layer is configured by one kind or more metals of platinum, gold, ruthenium, and iridium. On account of this, there is provided an effect of causing no deterioration in the function thereof in the process environment.

According to one aspect of the present invention, the main conduction layer is configured by platinum, the diffusion suppressing layer is configured by platinum and titanium oxide, and the adhesive layer is configured by titanium. On account of this, there is provided an effect that the titanium, which tends to be oxidized easily and is rapidly oxidized in the diffusion suppressing layer forming process, performs both a fixing of the titanium under diffusion and a closing of the diffusion path.

Regarding a constituting ratio of the compounds in the diffusion suppressing layer, it is varied in correspondence with a forming technique on each layer and the manufacturing conditions thereof, and can not be determined uniquely. When it is expressed using a ratio of metal atoms only, an analysis made by X-ray photoelectron spectroscopy has shown that the diffusion suppressing effect turns out to be effective in a composition in which content of the metal atoms originating from the compounds falls in a range of 5 atomic % to 70 atomic %. When the content is 5 atomic % or less, the diffusion path has not been closed enough, and thus the diffusion suppressing effect is insufficient yet. Also, when the content is 70 atomic % or less, the adhesive property between the diffusion suppressing layer and the conduction layer is deteriorated, which is not satisfactory.

An examination result on the adhesive property, which is obtained by using a scratch tester with a diamond needle, has shown the following: If the adhesive force falls below 50 mN, troubles such as the peeling are likely to happen, and, in order to improve a reliability on the process, it is effective and necessary to have an adhesive force the magnitude of which is at least 50 mN, or preferably not less than 100 mN.

A dielectric thin film has been formed at a substrate temperature of 600° C. with a forming time of 1.5 hours on a comparatively thin electrode, the whole constitution of which is about 200 nm thick and in which titanium and platinum are employed as a general adhesive layer and a conduction layer, respectively. In this case, an analysis made by X-ray photoelectron spectroscopy has shown that 5 to 10 atomic % titanium is diffused in the platinum layer which is to become a main conduction layer. The diffusion of titanium results in a deterioration in crystalline property of the dielectric thin film. In order to improve the crystalline property of the dielectric thin film, it is effective to make the titanium diffusion quantity less than at least 5 atomic %.

In order to enhance the adhesive property between the diffusion suppressing layer and the main conduction layer, it is effective to contain within the diffusion suppressing layer a metal element constituting the main conduction layer. The main conduction layer is not specified as long as it is made from a material the function of which is not deteriorated in the process environment. Mentioned as the superior material can be platinum, gold, iridium, ruthenium, and so on. Iridium oxides can also be employed in a point that the conductivity is maintained, although there is a possibility of their being easily reduced into the iridium. The ruthenium is also effective because, even when it is oxidized, the conductivity thereof can be maintained.

Selected as the most effective combination from among them is: platinum which is most stable chemically and selected as a material constituting the main conduction layer, titanium which has an excellent adhesive property and selected as a material constituting the adhesive layer, and platinum and titanium oxides selected as the diffusion suppressing layer. The titanium, which tends to be oxidized easily and is rapidly oxidized into the oxides thereof in the diffusion suppressing layer forming process, is capable of performing both a fixing of the titanium under diffusion and a closing of the diffusion path.

According to one aspect of the present invention, effective is a method of manufacturing the electrode for dielectric thin film device, comprising the steps of: forming a base metal constituting the diffusion suppressing layer, as a second metal thin film, on the adhesive layer, i.e. a first metal thin film, thereafter diffusing an element constituting the adhesive layer into the base metal through a heat treatment, and then performing a treatment of producing a compound such as an oxidizing treatment. The employment of these steps makes it possible, by producing a compound from the element diffused and implanted into the base metal, to fix the diffusion-implanted element as well as to close the diffusion path thereof, thus almost suppressing the element diffusion from the adhesive layer after the steps.

Concrete processes in the above-mentioned manufacturing method are as follows: forming on a substrate the first metal thin film which is to finally form the adhesive layer, and forming on the first metal thin film the second metal thin film which is to finally form the diffusion suppressing layer, thereafter carrying out the heat treatment of the first and the second metal thin films in an oxidizing or nitriding atmosphere, diffusing the constituting element of the first metal thin film into the second metal thin film and then executing the formation of the compound. After that, it is effective to employ a processing step of forming a third metal thin film which is to become the main conduction layer.

On account of this, the first metal thin film forms the adhesive layer, the second metal thin film forms the diffusion suppressing layer, and the third metal thin film forms the main conduction layer of a superior crystalline property into which no element diffusion occurs from the substrate or the adhesive layer. Accordingly, a crystalline property of a dielectric thin film, which is to be formed on the third metal thin film, becomes excellent, and thus there is provided an effect of increasing characteristics of a device to which the dielectric thin film is applied.

According to one aspect of the present invention, the method of manufacturing the electrode for dielectric thin film device is advantageous to improve the adhesive property, if the diffusion or the producing a compound is performed by operations such as a heat treatment since the second metal thin film at this time mainly contains metal constituents of the third metal thin film. Further, it is effective to distinguish the diffusion heat treatment step from the step of producing a compound. With the atmosphere being neutral at the time of the diffusion heat treatment, performing the diffusion only makes it possible to effectively control the diffusion of the metal element in the first metal thin film into the second metal thin film.

Also, a crystalline property of the third metal thin film is desired to be superior because it directly influences the crystalline property of the dielectric thin film to be formed thereon. In many cases, the higher the forming temperature gets, the better a crystalline property becomes. However, in the case of a general electrode having no diffusion suppressing layer, when forming at a high temperature the electrode layer (main conduction layer) comprising the third metal thin film being in contact with the dielectric, there occurs a possibility that an element diffusion from the adhesive layer deteriorates the crystalline property, or different phases, which exerts bad influence on the dielectric layer, are created.

According to one aspect of the present invention, the method of manufacturing the electrode for dielectric thin film device is a method in which the first metal thin film is configured by one kind or more of titanium, chromium, tantalum, vanadium, and niobium, and the second and the third metal thin films are configured by one kind or more metals of platinum, gold, ruthenium, and iridium. On account of this, there is furnished the following effects: If the metal element constituting the first metal thin film is diffused into the second metal thin film, produced into a compound, and become the oxides or the nitrides thereof, they act as the diffusion suppressing layer to prevent further diffusion into the third metal thin film, while enhancing an adhesive property and a junction property between the first metal thin film as the adhesive layer and the second metal thin film as the diffusion suppressing layer.

In the case of the present electrode configuration, formation of the diffusion suppressing layer prevents the above-mentioned diffusion, which makes it possible to freely select a forming temperature of the third metal thin film, and, especially, makes it possible to form the third metal thin film at a high temperature greater than the heat treatment temperature after formation of the second metal thin film. This enhances a crystalline property of the third metal thin film, and eventually improves a crystalline property and characteristics of the dielectric thin film, thus embodying an improvement in the device characteristics.

The electrode according to the present invention makes it possible to form a dielectric thin film which is of distinguished characteristics even though the electrode thickness is thin. In particular, in a thin electrode the electrode thickness of which is not greater than 5000 angstrom, the effect becomes distinguished. In an electrode thickness less than 2000 angstrom and for the conventional electrode having no diffusion suppressing layer, the effect becomes extremely distinguished. Incidentally, there is no limit in the above-mentioned thin film formation, and thus the similar effect can be obtained no matter what forming method is employed.

According to one aspect of the present invention, the ultrasonic wave oscillator is an apparatus in which the above-described electrode for dielectric thin film device or an electrode formed by using the manufacturing method thereof is employed. On account of this, the crystalline property of the dielectric thin film, which is formed on the first metal thin film as the main conduction layer, exhibits distinguished characteristics, and accordingly there is provided an effect that the dielectric thin film becomes loss-restrained and of high performance.

DETAILED DESCRIPTION OF THE PREFERRED EMBODIMENTS

Embodiments of the present invention will be described below.
First Embodiment

Figure 1:
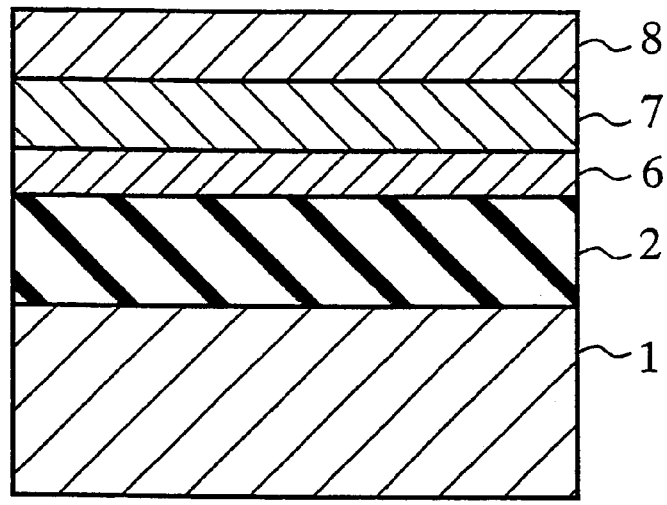
FIG. 1 is a cross sectional view showing a configuration of an electrode for dielectric thin film device according to a first embodiment of the present invention.

FIG. 1 is a cross sectional view showing a configuration of an electrode for dielectric thin film device according to a first embodiment of the present invention. In FIG. 1, reference numerals respectively designate the following: 1, a substrate such as a single crystal silicon, 2, an insulating film such as a silicon dioxide, 6, a first metal thin film as an adhesive layer comprising titanium, chromium, tantalum, vanadium, niobium, zirconium and so on, 7, a second metal thin film as a diffusion suppressing layer constituting oxides or nitrides of these metals, 8, a third metal thin film as a main conduction layer comprising platinum, gold, iridium, ruthenium and so on.

The insulating film 2 is formed on the substrate 1 by CVD represented by plasma CVD, using a reaction gas containing silane and oxygen. The first metal thin film 6 and the second metal thin film 7 are formed by PVD represented by high frequency magnetron sputtering. After forming the first metal thin film 6 and the second metal thin film 7, in order to form a diffusion suppressing layer in the second metal thin film 7, a heat treatment at about 600° C. diffuses a metal element such as titanium constituting the first metal thin film 6. Continuously or simultaneously, a treatment of producing a compound from the two thin films, the first metal thin film 6 and the second metal thin film 7, is performed in an oxygen/argon based oxidizing atmosphere or an argon/ammonia based nitriding atmosphere so as to produce a compound as the oxide or the nitride from an element which originates from the first metal thin film 6 and has been diffused and implanted into the second metal thin film 7. Then, the diffusion path is closed by fixing the compound within the second metal thin film 7. After that, the third metal thin film 8 is formed on the second metal thin film 7 by PVD such as the high frequency magnetron sputtering. Additionally, the above-mentioned oxide and nitride forming processes may be employed at the same time.

The operation will be explained hereunder.

According to the above-described electrode for dielectric thin film device, the first metal thin film 6 as the adhesive layer is employed, through the second metal thin film 7 as the diffusion suppressing layer comprising platinum and so on, in order to strengthen an adhesive property between the third metal thin film 8 as the main conduction layer and the substrate 1. Despite this fact, a metal element such as titanium, i.e. the main constituent of the first metal thin film, is diffused into the third metal thin film 8 as a main conduction layer which also comprises platinum and so on. This gives rise to a creation of different phases and a decrease in a crystalline property, thus resulting in a deterioration in characteristics of the dielectric thin film to be formed thereon. However, by means of the next treatment of producing a compound such as the oxidizing or nitriding treatment, the metal element such as titanium, which has been diffused from the first metal thin film into the second metal thin film, becomes the oxide or the nitride to form the diffusion suppressing layer, thus playing a role as a stopper to prevent unnecessary diffusion into the dielectric thin film formed on a completed electrode. As a result, it becomes possible to freely select a forming temperature of the third metal thin film. This makes it possible to carry out the formation at 700° C. or more, thus improving the crystalline property. Consequently, the characteristics of the dielectric thin film device, which has been completed by using such an electrode, has been embodied.

Furthermore, even though the electrode thickness is thin, the third metal thin film as the main conduction layer exhibits no performance deterioration due to impurities, and is applicable to almost all devices to which the dielectric thin film is applied. In particular, the device characteristics can be improved by employing it in apparatuses having a limited electrode film thickness such as a piezoelectric oscillator, an ultrasonic wave oscillator, or a pyroelectric type infrared rays sensor.

Figure 2A:
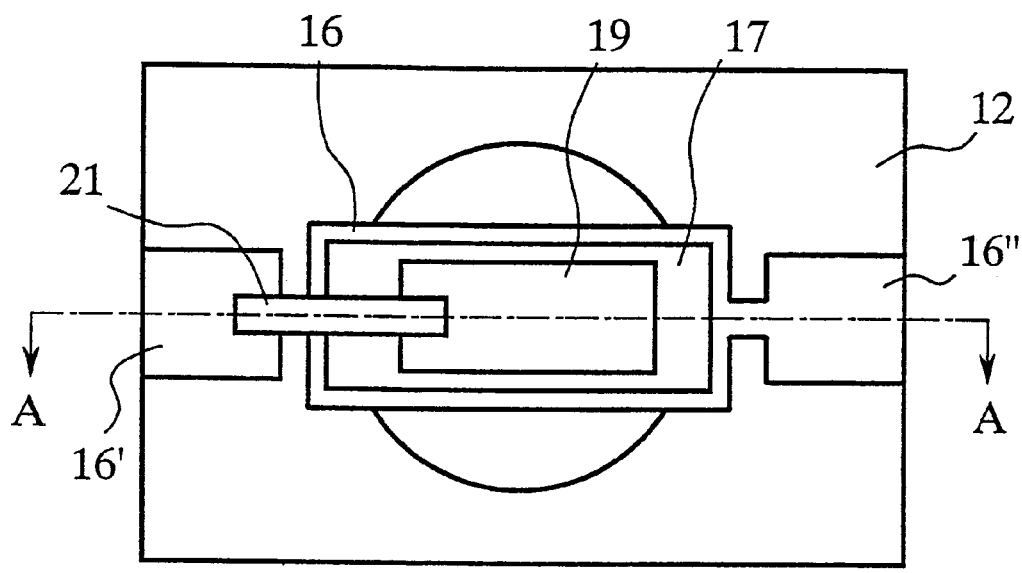
FIGS. 2A and 2B are schematic views showing an ultrasonic wave oscillator according to a second embodiment and an example 7 of the present invention, and are a plan view and a cross sectional view along A—A line, respectively.
Figure 2B:
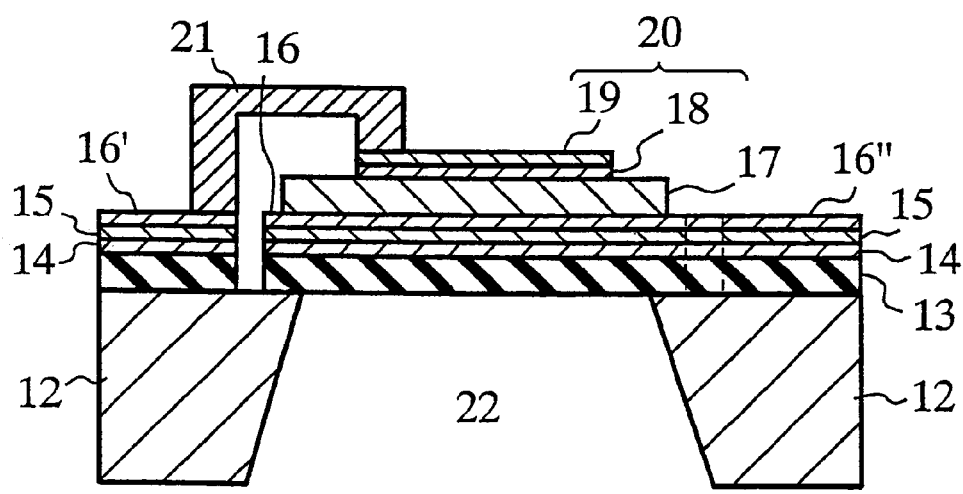

As described above, according to the first embodiment, the employment of the electrode for dielectric thin film device, for thin film devices in general to which a dielectric is applied, makes it possible to greatly improve characteristics of a dielectric thin film which determine characteristics of the devices as well as to obtain an effect of making the device characteristics even higher.
Second Embodiment FIG. 2A is a plan view showing an ultrasonic wave oscillator according to a second embodiment of the present invention, and FIG. 2B is a cross sectional view of FIG. 2A taken along line 2B—2B. In the drawings, reference numerals respectively designate the following: 12, a substrate made of single crystal silicon, 13, an insulating film made of silicon dioxide, 14, a first metal thin film as an adhesive layer comprising titanium, chromium, tantalum, vanadium, niobium and so on, 15, a second metal thin film as a diffusion suppressing layer comprising oxides or nitrides of these first metal thin films, 16, a third metal thin film as a main conduction layer comprising platinum and so on and constituting a lower part electrode, 16', an upper part electrode pad comprising platinum and so on, 16", a lower part electrode pad extracted from the upper part electrode pad 16', 17, a dielectric thin film made of lead titanate, 20, an upper part electrode consisting of two-layered configuration of titanium 18 and platinum 19, 21, an air bridge which is manufactured by gold plating and connected to the upper part electrode 20.

The description will be given below concerning a method of forming the ultrasonic wave oscillator.

The insulating film 13 of silicon dioxide base is formed on the substrate 12 by CVD represented by plasma CVD, using a reaction gas containing silane and oxygen. Two-layered thin film consisting of the first metal thin film 14 and the second metal thin film 15 is formed on the insulating film 13 by PVD represented by high frequency magnetron sputtering, as is the case with the above-described first embodiment. Then, the heat treatment and the oxidizing treatment are executed continuously or simultaneously in an oxygen/argon based mixture gas or an argon/ammonia based mixture gas. This processing step performs the diffusion of titanium and the oxidizing or the nitriding thereof in the second metal thin film comprising platinum and so on, thus forming an adhesive layer and a diffusion suppressing layer. The third metal thin film 16 is formed thereon by the high frequency magnetron sputtering so as to obtain an electrode for dielectric thin film device.

The dielectric thin film 17 is obtained by performing a film forming on the electrode by means of PVD such as the high frequency magnetron sputtering, using a lead titanate sintered target. Then, the dielectric thin film 17 is etched through the photolithography by a mixed solution of nitric acid and hydrochloric acid, and the patterning thereof is performed with 100 μm square. After that, the electrode formed by ion milling is etching-removed, leaving a lower part of the dielectric thin film 17 made of lead titanate, the lower part electrode pad 16", the connection portion, and the upper part electrode pad 16'. At that time, concerning the upper part electrode 20 consisting of two-layered configuration of platinum/titanium with 50 μm square on the lead titanate film, the evaporation of a metal film, which is to become the upper part electrode 20, is executed using an electron beam evaporation method. Employed for a shape formation of the upper part electrode 20 is the following lift off method: a resist is formed in advance on a metal film removal region, and after an evaporation of the metal film, the resist is removed, and then unnecessary metal film, too, is removed accordingly. This is the way the patterning is executed in the lift off method. The connection between the upper part electrode 20 and the upper part electrode pad portion 16' is established by formation of the air bridge manufactured by gold-plate. These successive processing steps complete an upper structure of the ultrasonic wave oscillator.

Thereafter, employing gold/titanium as an etching mask on the rear side of the substrate 12 and employing potassium hydroxide as an etchant, a portion of the lead titanate film and that of the substrate 12 under the electrode part are removed by an anisotropic etching of the silicon in the substrate 12, thereby completing the ultrasonic wave oscillator.

The operation will be explained hereunder.

A voltage applied to the upper part electrode 20 and the lower part electrode 16 causes the oscillator to perform resonance at a proper frequency in correspondence with thickness of the thin film layer defined between both the electrodes. This allows a signal of a fixed ultrasonic wave frequency to be generated or to pass through.

As explained above, according to the second embodiment, a mixture of unnecessary elements, which brings about a characteristic deterioration in the dielectric thin film 17 in the electrode constituting the ultrasonic wave oscillator, does not occur, thus making it possible to obtain an effect of reducing the loss.

The description will be given below concerning the examples, referring to a comparative example:

COMPARATIVE EXAMPLE 1

Figure 3:
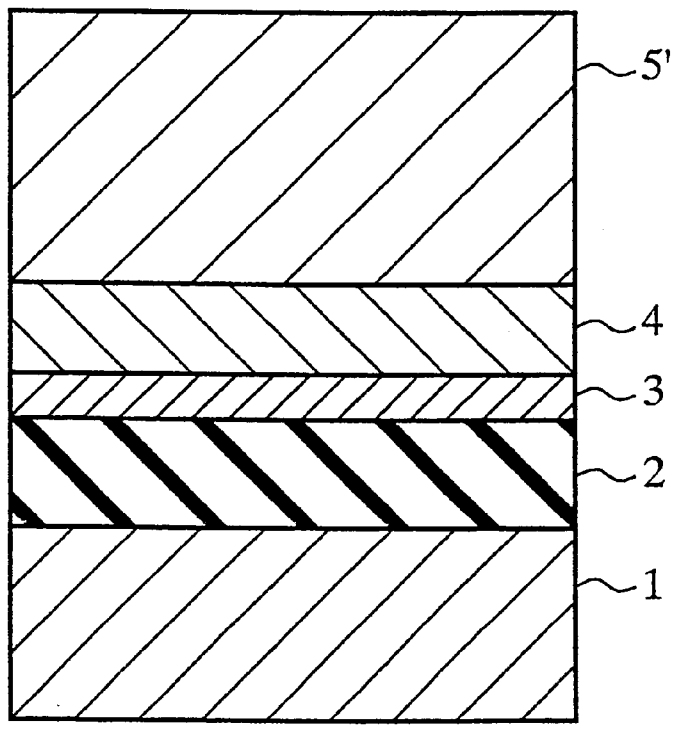
FIG. 3 is a cross sectional view showing a configuration of an electrode for dielectric thin film device and a dielectric thin film in a comparative example 1.

FIG. 3 is a schematic view of an electrode and a dielectric thin film manufactured. In FIG. 3, reference numerals respectively designate the following: 1, a substrate made of single crystal silicon, 2, an insulating film made of silicon dioxide, 3, a titanium layer, 4, a platinum layer, 5', a dielectric thin film made of lead titanate dielectric film.

Single crystal silicon is employed as the substrate 1. A silicon dioxide film about 200 nm thick is formed as the insulating film 2 on the substrate 1 by applying plasma CVD (chemical vapor deposition), using silane and oxygen as the reaction gas at a film forming temperature of 300° C. Two-layered thin film, which consists of the titanium layer 3 the film thickness of which is 30 nm and the platinum layer 4 the film thickness of which is 70 nm, is manufactured on the insulating layer 2 at a room temperature by applying high frequency magnetron sputtering. A film forming is performed on the electrode comprising the two-layered thin film with a high frequency power of 100 W at a substrate temperature of 600° C. for about 1 hour by applying the high frequency magnetron sputtering, using a lead titanate sintered target which is in excess of 20 mol % lead and 3 inches in diameter, in a mixture gas of 10 volume % (flow rate 10 ccm) of oxygen gas and 90 volume % (flow rate 90 ccm) of argon gas at a pressure of 1 Pa. Obtained as the result is the dielectric thin film 5' made of lead titanate the film thickness of which is 9500 angstroms.

Concerning the dielectric thin film 5' thus obtained, an estimation of the crystalline property and the orientation characteristics thereof has been made using X-ray diffraction method. Employed for the estimation of the orientation characteristics is a rocking curve method based on 2θ angle fixing and θ angle driving, which is being widely used generally. This estimation has shown that the dielectric thin film 5' made of lead titanate, which has been obtained on the above-stated two-layered thin film electrode, has a (1 1 1) crystalline plane oriented in parallel with the plane of the substrate 1, and a value of σ obtained by the rocking curve measurement turns out to be 2.9°. The value of σ indicates that the smaller it gets, the greater the extent to which the (1 1 1) plane is oriented toward a specified plane becomes. Also, an intensity of a diffracted X-ray from the (1 1 1) plane, i.e. an orientation plane, has been found to be 11000 counts. The intensity indicates that the greater it becomes, the higher crystalline property the dielectric thin film 5' has.

Also, an analysis of the electrode part has been made by X-ray photoelectron spectroscopy, cutting off the thin film. Performing an estimation of the composition by estimating the element quantities with a peak area of each element obtained, it has been found that a titanium quantity within the platinum layer 4, which is a main conduction layer under the dielectric thin film 5', is 25 atomic %.

The description will be given below concerning the examples, referring to the comparative example:

EXAMPLE 1

Figure 4:
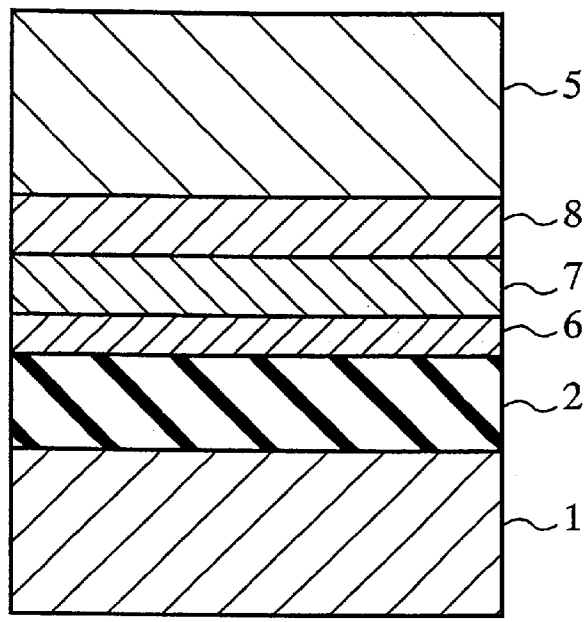
FIG. 4 is a cross sectional view showing a configuration of an electrode for dielectric thin film device and a dielectric thin film according to first to sixth embodiments of the present invention.

FIG. 4 is a schematic view of an electrode and a dielectric thin film manufactured. Reference numeral 6 designates a first metal thin film made of titanium as an adhesive layer, numeral 7 designates a second metal thin film made of platinum as a diffusion suppressing layer, and numeral 8 designates a third metal thin film made of platinum as a main conduction layer. The other components are the same as those in the above-mentioned comparative example 1, and thus the overlapped explanation will be omitted, giving the same part the same reference numeral.

As is the case with the comparative example 1, a silicon dioxide film about 200 nm thick is formed as an insulating film 2 on a substrate 1 by applying plasma CVD, using silane and oxygen at a film forming temperature of 300° C. Two-layered thin film, which consists of the first metal thin film 6 the titanium film thickness of which is 30 nm and the second metal thin film 7 the platinum film thickness of which is 35 nm, is manufactured on the insulating film 2 in a 100 volume % of argon atmosphere at a pressure of 0.5 Pa by applying high frequency magnetron sputtering. At that time, the titanium film and the platinum film are manufactured at a room temperature and at a temperature of 600° C., respectively.

After the formation of the two-layered thin film, the heat treatment and the oxidizing treatment are performed in a mixture gas of 10 volume % (flow rate 10 ccm) of oxygen gas and 90 volume % (flow rate 90 ccm) of argon gas at a pressure of 1 Pa at a substrate temperature of 550° C. for about 1 hour. This processing step executes a diffusion of titanium into the platinum layer, i.e. the second metal thin film 7, and executes the oxidization of the titanium diffused, thus forming the adhesive layer and the diffusion suppressing layer.

Moreover, the third metal thin film 8 the platinum film thickness of which is 35 nm, which is to become the main conduction layer, is formed by applying the high frequency magnetron sputtering in a 100 volume % of argon atmosphere at a pressure of 0.5 Pa at substrate temperatures described in Table 1. A film forming is performed on the obtained electrode with a high frequency power of 100 W at a substrate temperature of 600° C. for about 1 hour by applying the high frequency magnetron sputtering, using a lead titanate sintered target which is in excess of 20 mol % lead and 3 inches in diameter, in a mixture gas of 10 volume % (flow rate 10 ccm) of oxygen gas and 90 volume % (flow rate 90 ccm) of argon gas at a pressure of 1 Pa. Obtained as the result is a dielectric thin film 5 made of lead titanate the film thickness of which is 9500 nm.

An estimation of the dielectric thin film 5 thus obtained, which is much the same way as the estimation in the comparative example 1, has revealed that regarding the crystalline orientation, the (1 1 1) crystalline plane is oriented in parallel with the substrate plane. Shown in Table 1 are a value of σ obtained by the rocking curve measurement and an intensity of a diffracted X-ray from the (1 1 1) plane, i.e. an orientation plane. Both of them have been recognized to exhibit enhancements in the orientation property and the crystalline property. Shown in Table 2 are a titanium quantity within the third metal thin film 8, which is the main conduction layer under the dielectric thin film 5 analyzed by x-ray photoelectron spectroscopy. Suppression of the diffusion has been ascertained for every material in Table 2.

TABLE 1

| Forming temperature for second metal thin film [° C.] | Value of σ of dielectric thin film [°] | X-ray diffraction intensity from dielectric thin film (111) plane [counts] |
| --- | --- | --- |
| Room temperature | 1.9 | 22000 |
| 300 | 1.6 | 27000 |
| 600 | 1.4 | 63000 |
| 700 | 1.3 | 86000 |

Figure 5:
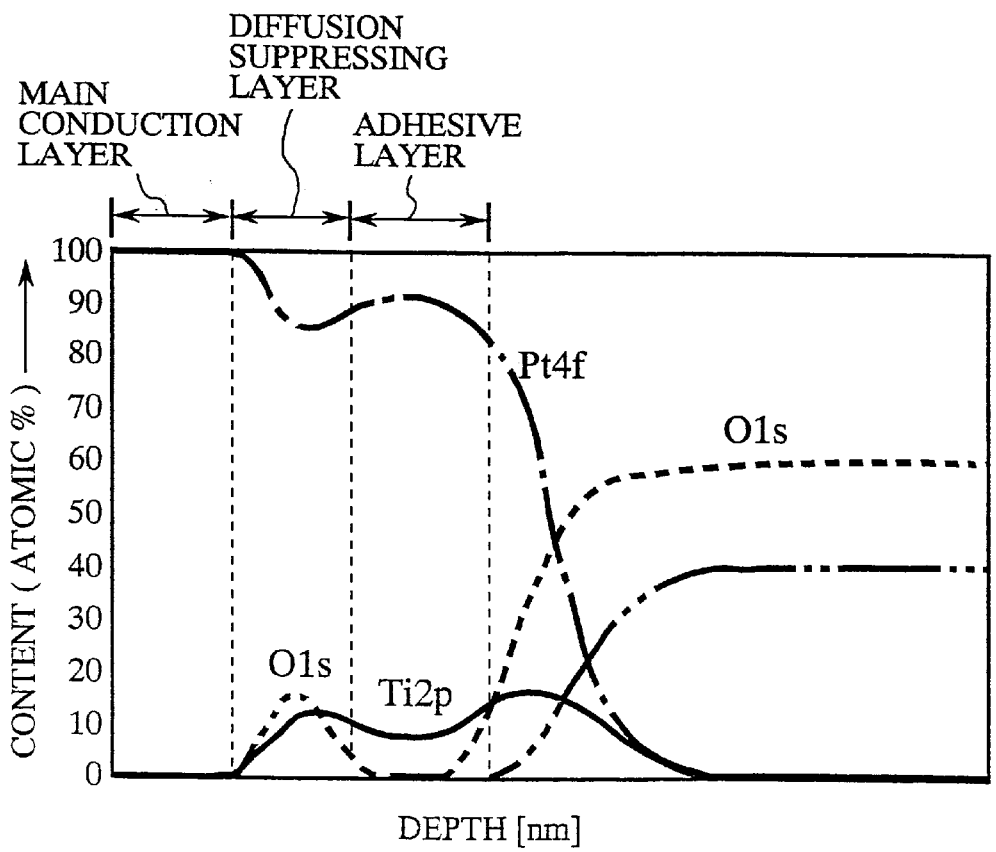
FIG. 5 is a graph showing an analysis result of an electrode for dielectric thin film device according to a first embodiment of the present invention.

Also, an analysis of the element distribution in an electrode depth direction has been made by applying the X-ray photoelectron spectroscopy (XPS). FIG. 5 shows a typical example thereof, which is an analysis result of a sample obtained by forming the second metal thin film at a temperature of 600° C. The XPS makes it possible to obtain an analysis result on a chemical bond state of elements, and shown in FIG. 5 are element distributions based on signals from titanium Ti2p, oxygen O1s, and platinum Pt4f. Taking these distributions into consideration, it has been found that the electrode is constituted by: the main conduction layer basically made of platinum only, the diffusion suppressing layer made of platinum and titanium oxides, and the adhesive layer made of titanium, which is the primary constituent thereof, and platinum diffused from the second metal thin film 7.

EXAMPLE 2

As is the case with the above-mentioned example 1, an insulating film 2 is formed on a substrate 1. Two-layered thin film, which for the materials described in Table 2, consists of a first metal thin film 6, which is to become an adhesive layer and the film thickness of which is taken to be 30 nm, and a second metal thin film 7, which is to become a diffusion suppressing layer and the film thickness of which is taken to be 35 nm, is manufactured on the insulating film 2 in a 100 volume % of argon atmosphere at a pressure of 0.5 Pa at a room temperature by applying high frequency magnetron sputtering. After the formation of the two-layered thin film, the heat treatment and the oxidizing treatment are performed in a mixture gas of 10 volume % of oxygen gas and 90 volume % of argon gas at a pressure of 1 Pa at a temperature of 600° C. for about 1 hour. This processing step performs formation of an adhesive layer and a diffusion suppressing layer.

Moreover, a third metal thin film 8, which is to become a main conduction layer and the film thickness of which is taken to be 35 nm using the materials described in Table 2, is formed by applying the high frequency magnetron sputtering at a room temperature. A lead titanate dielectric film is formed on the obtained electrode, as is the case with the example 1. Included also in Table 2 is a result obtained by performing an estimation of the dielectric thin film thus obtained, which has been performed in much the same way as the estimation in the comparative example 1. For every material shown in Table 2, enhancements in the orientation property and the crystalline property have been recognized, and diffusion of the adhesive layer element has been suppressed.

TABLE 2

| Material for third metal thin film | Material for second metal thin film | Material for first metal thin film | Value of σ of dielectric thin film (111) plane [°] | X-ray diffraction intensity from dielectric thin film (111) plane [counts] | Concentration of metal atoms originating from first metal thin film in metal atoms constituting third metal thin film [atomic %] |
|---|---|---|---|---|---|
| Pt | Pt | Cr | 2.1 | 21000 | 0.5 |
| Pt | Pt | Ta | 1.6 | 22000 | 0.5 |
| Pt | Pt | V  | 1.7 | 26000 | 0.3 |
| Pt | Pt | Nb | 1.7 | 18000 | 0.3 |
| Pt | Ir | Cr | 1.7 | 25000 | 0.3 |
| Pt | Ir | Ta | 1.9 | 21000 | 0.4 |
| Pt | Ir | V  | 1.8 | 20000 | 0.3 |
| Pt | Ir | Nb | 1.7 | 28000 | 0.5 |
| Pt | Ir | Ti | 1.8 | 23000 | 0.4 |
| Ir | Ir | Nb | 2.2 | 18000 | 0.3 |
| Ir | Ir | Cr | 2.1 | 19000 | 0.5 |
| Ir | Ir | Ta | 2.2 | 22000 | 0.5 |
| Ir | Ir | V  | 2.2 | 18000 | 0.3 |
| Ir | Ir | Nb | 2.1 | 25000 | 0.6 |
| Ir | Ir | Ti | 2.2 | 27000 | 0.3 |
| Au | Pt | Ti | 2.5 | 15000 | 0.5 |
| Au | Pt | Cr | 2.4 | 17000 | 0.7 |
| Ru | Pt | Ti | 2.3 | 17000 | 0.3 |
| Ru | Ir | Ti | 2.3 | 18000 | 0.7 |
| Ir | Pt | Cr | 2.1 | 26000 | 0.4 |
| Ir | Pt | Ti | 2.2 | 22000 | 0.5 | at a pressure of 1 Pa under the conditions described in Table 3, thus forming an adhesive layer and a diffusion suppressing layer.

Moreover, a film, which is to become a main conduction layer and the film thickness of which is 35 nm, is formed in a 100 volume % of argon at a gas pressure of 0.5 Pa at a room temperature by applying the high frequency magnetron sputtering. A lead titanate dielectric thin film 5 is formed on the obtained electrode, as is the case with the example 1.

Shown in Table 3 are a result obtained by estimating an orientation characteristic crystalline property of the dielectric thin film 5, which has been estimated in much the same way as the estimation in the comparative example 1, as well as a result of composition of the diffusion suppressing layer, which has been obtained by using XPS. Also, concerning an adhesive force, the estimation thereof has been made by using a scratch tester with a diamond needle, inspecting a portion to which the lead titanate is not attached. The result is also shown in Table 3.

TABLE 3

| Platinum film thickness [nm] | Heat treatment temperature [° C.] | Heat treatment time [h] | Value of σ of dielectric thin film (111) plane [°] | X-ray diffraction intensity from dielectric thin film (111) plane [counts] | Concentration of titanium atoms originating from titanium oxides in diffusion suppressing layer metal atoms [atomic %] | Concentration of titanium atoms in main conduction layer metal atoms [atomic %] | Adhesive property of main conduction layer [mN] |
|---|---|---|---|---|---|---|---|
| 250 | 600 | 1 | 1.8 | 25000 | 1.0 | 0.8 | 152 |
| 100 | 600 | 1 | 1.9 | 27000 | 2.2 | 0.7 | 141 |
| 35  | 600 | 1 | 1.9 | 21000 | 15  | 0.6 | 120 |
| 20  | 600 | 1 | 1.8 | 23000 | 22  | 0.8 | 86  |
| 15  | 600 | 1 | 1.7 | 24000 | 47  | 1.2 | 62  |
| 10  | 700 | 1 | 1.7 | 28000 | 71  | 2.6 | 55  |
| 10  | 700 | 2 | 1.8 | 75000 | 76  | 3.3 | 42  |

EXAMPLE 3

As is the case with the above-mentioned example 1, an insulating film 2 is formed on a substrate 1. A titanium thin film, which is to become an adhesive layer and the film thickness of which is 30 nm, is formed on the insulating film 2 in a 100 volume % of argon at a gas pressure of 0.5 Pa at a room temperature by applying high frequency magnetron sputtering. In much the same way, a film, the film thickness of which is taken to be values described in Table 3, is formed in a 100 volume % of argon atmosphere at a gas pressure of 0.5 Pa at a room temperature by applying the high frequency magnetron sputtering. After the formation of the two-layered thin film, the heat treatment is performed in a mixture gas of 10 volume % of oxygen gas and 90 volume % of argon gas

EXAMPLE 4

As is the case with the above-mentioned example 1, an insulating film 2 is formed on a substrate 1. A first metal thin film 6, the titanium film thickness of which is 30 nm, is formed on the insulating film 2 in a 100 volume % of argon gas at a gas pressure of 0.5 Pa at a room temperature by applying high frequency magnetron sputtering. After that, a second metal thin film 7 the film thickness of which is 40 nm is formed in a mixture gas of 60 volume % of argon gas and 40 volume % of ammonia gas at a gas pressure of 1 Pa at a substrate temperature of 600° C. by applying the high frequency magnetron sputtering, using a composite target of platinum and titanium.

An analysis result obtained by XPS has shown that the platinum lies in a metallic state and the titanium forms the nitride, and in the composition in terms of metal element only, the platinum occupies 60 atomic % and the titanium occupies 40 atomic %. Moreover, the platinum film, the film thickness of which is 35 nm, is manufactured on the mixture film by applying the high frequency magnetron sputtering in a 100 volume % of argon atmosphere at a pressure of 0.5 Pa at a room temperature, thus obtaining an electrode. A lead titanate dielectric film is formed on the electrode obtained, as is the case with the example 1. The obtained dielectric thin film is oriented toward the (1 1 1) plane and the σ value turns out to be 2.1, and the X-ray diffraction intensity from the (1 1 1) plane has been found to be 18000 counts/sec.

EXAMPLE 5

As is the case with the example 1, the formation has been executed up to a step of a second metal thin film 7, a platinum thin film. Annealing of the two-layered thin film, which consists of titanium and platinum, is performed for an hour in a 100 volume % of argon atmosphere at a pressure of 0.5 Pa so as to carry out a diffusion of the titanium into the platinum layer in the second metal thin film 7. After the formation of the two-layered thin film, the oxidizing treatment is performed in a mixture gas of 10 volume % of oxygen gas and 90 volume % of argon gas at a pressure of 1 Pa at a temperature of 600° C. for about 1 hour. This processing step carries out an oxidization of the titanium in the platinum layer, thus forming an adhesive layer and a diffusion suppressing layer.

Furthermore, a third metal thin film 8, which is to become a main conduction layer is a platinum film with a thickness of which is 35 nm, and is formed by applying the high frequency magnetron sputtering. The forming method is the same as the case with the platinum in the second metal thin film 7 in the example 1. A dielectric thin film 5 made of a lead titanate which is in excess of 20 mol % lead and 3 inches in diameter is obtained on the obtained electrode in a mixture gas of 10 volume % (flow rate 10 ccm) of oxygen gas and 90 volume % (flow rate 90 ccm) of argon gas at a pressure of 1 Pa.

An estimation of the dielectric thin film 5 thus obtained, which is much the same way as the estimation in the comparative example 1, has revealed that regarding the crystalline orientation, the (1 1 1) crystalline plane is oriented in parallel with the substrate plane. The value of σ obtained by the rocking curve measurement has proved to be 1.5, and the intensity of a diffracted X-ray from the (1 1 1) plane; i.e. an orientation plane, has turned out to be 75000 counts/sec, and improvements in the orientation property and the crystalline property have been recognized. Also, according to the composition estimation made by X-ray photoelectron spectroscopy, a titanium quantity in the platinum layer in proximity to the dielectric thin film has been found to be 0.8 atomic %, which ascertains suppression of the titanium diffusion.

EXAMPLE 6

As is the case with the example 1, the formation has been executed up to a step of a second metal thin film 7, a platinum thin film. Annealing of the two-layered thin film, which consists of titanium and platinum, is performed for an hour in a 100 volume % of argon atmosphere at a pressure of 0.5 Pa so as to carry out a diffusion of the titanium into the platinum layer in the second metal thin film 7. After the formation of the two-layered thin film, the oxidizing treatment is performed in a mixture gas of 10 volume % of oxygen gas and 90 volume % of argon gas at a pressure of 1 Pa at a temperature of 600° C. for about 1 hour. This processing step carries out an oxidation of the titanium in the platinum layer, thus forming an adhesive layer and a diffusion suppressing layer. Furthermore, a platinum film, which is to become a main conduction layer and the film thickness of which is 35 nm, is formed by applying the high frequency magnetron sputtering in a 100 volume % of argon gas at a pressure of 0.5 Pa at a substrate temperature of 650° C.

A film forming is performed on the obtained electrode with a high frequency power of 100 W at a substrate temperature of 600° C. for about 1 hour by applying the high frequency magnetron sputtering, using a lead titanate sintered target which is in excess of 20 mol % lead and 3 inches in diameter, in a mixture gas of 10 volume % (flow rate 10 ccm) of oxygen gas and 90 volume % (flow rate 90 ccm) of argon gas at a pressure of 1 Pa. Obtained as the result is a dielectric thin film 5 made of lead titanate the film thickness of which is 9500 nm.

An estimation of the dielectric thin film 5 thus obtained, which is much the same way as the estimation in the comparative example 1, has revealed that regarding the crystalline orientation, the (1 1 1) crystalline plane is oriented in parallel with the substrate plane. The value of σ obtained by the rocking curve measurement has proved to be 1.3, and the intensity of a diffracted X-ray from the (1 1 1) plane, i.e. an orientation plane, has turned out to be 75000 counts/sec, and enhancements in the orientation property and the crystalline property have been recognized. Also, according to the composition estimation made by X-ray photoelectron spectroscopy, a titanium quantity in the platinum layer in proximity to the dielectric thin film has been found to be 1.2 atomic %, which ascertains suppression of the titanium diffusion.

EXAMPLE 7

An ultrasonic wave oscillator is manufactured, using the electrode and the dielectric thin film in the example 1. The description thereof will be given below, referring to FIGS. 2A, 2B: Single crystal silicon is employed as a substrate 12. A silicon dioxide film about 200 nm thick is formed as an insulating film 13 on the substrate 1 by applying plasma CVD (chemical vapor deposition), using silane and oxygen as the reaction gas at a film forming temperature of 300° C. Two-layered thin film, which consists of a first metal thin titanium film 14 the film thickness of which is 30 nm and a second metal thin platinum film 15 the platinum film thickness of which is 35 nm, is manufactured on the insulating film 13 in a 100 volume % of argon atmosphere at a pressure of 0.5 Pa by applying high frequency magnetron sputtering. At that time, the titanium film and the platinum film are manufactured at a room temperature and at a temperature of 600° C., respectively.

After the formation of the two-layered thin film, the heat treatment and the oxidizing treatment are performed in a mixture gas of 10 volume % (flow rate 10 ccm) of oxygen gas and 90 volume % (flow rate 90 ccm) of argon gas at a pressure of 1 Pa at a temperature of 600° C. for about 1 hour. This processing step executes a diffusion of titanium into the platinum layer,.i.e. the second metal thin film 15, and executes the oxidation of the titanium diffused, thus forming an adhesive layer and a diffusion suppressing layer. Moreover, a third metal thin film 16 the platinum film thickness of which is 35 nm, which is to become the main conduction layer, is formed by applying the high frequency magnetron sputtering in a 100 volume % of argon atmosphere at a pressure of 0.5 Pa at a room temperature.

A film forming is performed on the obtained electrode with a high frequency power of 100 W at a substrate temperature of 600° C. for about 1 hour by applying the high frequency magnetron sputtering, using a lead titanate sintered target which is in excess of 20 mol % lead and 3 inches in diameter, in a mixture gas of 10 volume % (flow rate 10 ccm) of oxygen gas and 90 volume % (flow rate 90 ccm) of argon gas at a pressure of 1 Pa. Obtained as the result is a dielectric thin film 17 made of lead titanate the film thickness of which is 9500 nm.

A patterning of the dielectric thin film thus obtained is performed with 100 μm square by using a mixed solution of nitric acid and hydrochloric acid. After that, the electrode formed by ion milling is etching-removed, leaving a lower part of the dielectric thin film 17 made of lead titanate, the lower part electrode pad 16", the connection portion, and the upper part electrode pad 16'.

Employed for a shape formation of an upper part electrode 20, which consists of platinum/titanium configuration with 50 μm square on the dielectric thin film 17 made of lead titanate, is the following lift off method: a resist is formed in advance on a metal film removal region, and after an evaporation of the metal film, the resist is removed, and then unnecessary metal film, too, is removed accordingly. This is the way the patterning is executed in the lift off method.

The connection between the upper part electrode 20 and the upper part electrode pad portion 16' is established by formation of an air bridge 21 manufactured by gold-plate, thus forming an upper structure of the ultrasonic wave oscillator. Thereafter, the rear side etching is performed by using potassium hydroxide, employing gold/titanium as an etching mask. The lead titanate film and the substrate 12 under the electrode part are partially removed by an anisotropic etching of the silicon so as to form a cavity 22, thereby manufacturing the ultrasonic wave oscillator.

The ultrasonic wave oscillator thus obtained has a dielectric thin film of superior crystalline property, as compared to the oscillator using the electrode in the prior art. A value of Q, which indicates the loss thereof, was 70 in the prior art. In the present invention, however, about two times of improvement has been made, and the value of Q has been improved up to 150.

What is claimed is:

1. An electrode structure comprising:

an electrically insulating film;

a metal adhesive film disposed on the electrically insulating film and including a metal selected from the group consisting of titanium, chromium, tantalum, vanadium, and niobium;

a metal film different in composition from the metal adhesive film, disposed on the metal adhesive film, and including one of an oxide and a nitride of the metal of the metal adhesive film for preventing diffusion of the metal of the metal adhesive film through the metal film; and a conductor film disposed on the metal film and selected from the group consisting of gold, platinum, iridium, and ruthenium.

2. The electrode structure as claimed in claim 1, wherein the metal film contains atoms of the metal of the conductor film.

3. The electrode structure as claimed in claim 1, wherein the metal film has a portion with a content of the metal of the metal adhesive film, when expressed using a ratio of metal elements only, in a range from more than 0 atomic % to 75 atomic %.

4. The electrode structure as claimed in claim 1, wherein the conductor film is platinum, the metal film includes platinum and titanium oxide, and the metal adhesive film is titanium.

5. An ultrasonic wave oscillator including an electrode structure comprising:

an electrically insulating film;

a metal adhesive film disposed on the electrically insulating film and including a metal selected from the group consisting of titanium, chromium, tantalum, vanadium, and niobium;

a metal film different in composition from the metal adhesive film, disposed on the metal adhesive film, and including one of an oxide and a nitride of the metal of the metal adhesive film for preventing diffusion of the metal of the metal adhesive film through the metal film; and a conductor film disposed on the metal film and selected from the group consisting of gold, platinum, iridium, and ruthenium.

* * * * *